(12) United States Patent
Choi

(10) Patent No.: US 8,987,695 B2
(45) Date of Patent: Mar. 24, 2015

(54) VARIABLE RESISTANCE MEMORY DEVICE AND METHOD FOR FABRICATING THE SAME

(71) Applicant: SK hynix Inc., Icheon (KR)

(72) Inventor: Hye-Jung Choi, Icheon (KR)

(73) Assignee: SK hynix Inc., Icheon (KR)

( * ) Notice: Subject to any disclaimer, the term of this patent is extended or adjusted under 35 U.S.C. 154(b) by 82 days.

(21) Appl. No.: 13/742,160

(22) Filed: Jan. 15, 2013

(65) Prior Publication Data

US 2014/0077142 A1 Mar. 20, 2014

(30) Foreign Application Priority Data

Sep. 20, 2012 (KR) .................. 10-2012-0104748

(51) Int. Cl.
*H01L 45/00* (2006.01)

(52) U.S. Cl.
CPC .............. *H01L 45/04* (2013.01); *H01L 45/16* (2013.01); *H01L 45/00* (2013.01)
USPC .................. 257/2; 257/E27.004; 257/E21.52; 438/382

(58) Field of Classification Search
None
See application file for complete search history.

(56) References Cited

U.S. PATENT DOCUMENTS

| | | | |
|---|---|---|---|
| 8,003,511 B2 | 8/2011 | Rinerson et al. | |
| 8,581,225 B2 * | 11/2013 | Himeno et al. | 257/4 |
| 2009/0278109 A1 * | 11/2009 | Phatak | 257/4 |
| 2013/0010529 A1 * | 1/2013 | Hayakawa et al. | 365/148 |
| 2013/0200326 A1 * | 8/2013 | Ju et al. | 257/4 |
| 2014/0061574 A1 * | 3/2014 | Pio | 257/5 |
| 2014/0061577 A1 * | 3/2014 | Kanno et al. | 257/5 |

FOREIGN PATENT DOCUMENTS

| | | |
|---|---|---|
| KR | 10-2007-0035650 A | 4/2007 |
| KR | 10-2011-0070559 A | 6/2011 |

OTHER PUBLICATIONS

Sethi, Guneet; Olszta, M.; Jing Li; Sloppy, J.; Horn, Mark W.; Dickey, Elizabeth C.; Lanagan, M.T., "Structure and dielectric properties of amorphous tantalum pentoxide thin film capacitors," Electrical Insulation and Dielectric Phenomena, 2007. CEIDP 2007. Annual Report—Conference on , vol., No., pp. 815,818, Oct. 14-17, 2007.*

* cited by examiner

*Primary Examiner* — Joseph Schoenholtz

(57) ABSTRACT

A method for fabricating a variable resistance device includes: providing a first insulating layer having a first electrode; forming a first oxide layer including a variable resistance material over the first electrode and the first insulating layer; forming a sacrifice pattern over the first oxide layer; forming a second oxide layer by reacting the first oxide layer exposed by the sacrifice pattern with oxygen; removing the sacrifice pattern; and forming a second electrode over the second oxide layer and the first oxide layer so as to be coupled to the first oxide layer.

21 Claims, 12 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0104748, filed on Sep. 20, 2012, which is incorporated herein by reference in its entirety.

BACKGROUND

1. Field

Exemplary embodiments of the present invention relate to a semiconductor technology, and more particularly, to a variable resistance memory device and a method for fabricating the same.

2. Description of the Related Art

A variable resistance memory device stores data using a variable resistance material which switches between different resistance states depending on an applied voltage or current. Currently, various variable resistance memory devices such as ReRAM (Resistive Random Access Memory), PCRAM (Phase-change Random Access Memory), FRAM (Ferroelectric Random Access Memory), and MRAM (Magnetic Random Access Memory) have been developed.

FIG. 1 is a cross-sectional view of a conventional variable resistance memory device.

Referring to FIG. 1, the variable resistance memory device includes a bottom electrode 100, a top electrode 120, and a variable resistance layer 110 interposed therebetween.

The variable resistance memory device may be fabricated by a series of processes of forming a bottom electrode 100 over a substrate (not shown) having a predetermined lower structure formed therein, depositing a variable resistance material on the resultant structure having the bottom electrode 100, forming a variable resistance layer 110 by selectively etching the variable resistance material, and forming a top electrode 120 over the variable resistance layer 110.

When the above-described fabrication method is used, sidewalls of the variable resistance layer 110 are damaged in the course of being etched. The damaged sidewalls may cause various problems. For example, sidewall characteristics of the variable resistance layer 110 may be changed, and a leakage current may occur through the sidewalls (denoted with a symbol 'L' in FIG. 1). Such problems may gradually increase as the device is scaled down.

SUMMARY

An embodiment of the present invention is directed to a variable resistance memory device and a method for fabricating the same, which is capable of facilitating and simplifying the process and improving the characteristic of the device.

In accordance with an embodiment of the present invention, a method for fabricating a variable resistance device includes: providing a first insulating layer having a first electrode; forming a first oxide layer including a variable resistance material over the first electrode and the first insulating layer; forming a sacrifice pattern over the first oxide layer; forming a second oxide layer by reacting the first oxide layer exposed by the sacrifice pattern with oxygen; removing the sacrifice pattern; and forming a second electrode over the second oxide layer and the first oxide layer so as to be coupled to the first oxide layer.

In accordance with another embodiment of the present invention, a method for fabricating a variable resistance memory device includes: providing a first insulating layer having a first electrode; forming a first oxide layer including a variable resistance material over the first electrode and the first insulating layer; forming a conductive contact over the first oxide layer; forming a second oxide layer by performing a plasma treatment on the first oxide layer exposed by the conductive contact in an oxygen atmosphere; and forming a second electrode over the conductive contact.

In accordance with yet another embodiment of the present invention, a method for fabricating a variable resistance memory device includes: providing a first insulating layer having a first electrode; forming a first oxide layer including a variable resistance material over the first electrode and the first insulating layer; forming a conductive contact over the first oxide layer; forming a second oxide layer by performing an annealing process on the first oxide layer exposed by the conductive contact in an oxygen atmosphere at an atmospheric pressure or more; and forming a second electrode over the conductive contact.

In accordance with still another embodiment of the present invention, a method for fabricating a variable resistance memory device includes: alternately stacking first layers and sacrifice layers over a substrate to form a stack structure; etching the stack structure to form a hole exposing sidewalls of the first layers and sidewalls of the sacrifice layers; forming a first oxide layer including a variable resistance material over a sidewall of the hole; forming a first electrode in the hole; removing the sacrifice layers to expose first portions of the first oxide layer; and forming a second oxide by reacting the exposed first portions of the first oxide layer with oxygen.

In accordance with still another embodiment of the present invention, a variable resistance memory device includes: a first electrode extending in a first direction; a second electrode disposed over the first electrode and extending in a second direction crossing the first direction; a first oxide layer coupling the first and second electrodes and including a variable resistance material; and a second oxide layer surrounding the first oxide layer and having an oxygen amount higher than the first oxide layer, wherein the second electrode is in direct contact with the first oxide layer.

In accordance with still another embodiment of the present invention, a variable resistance memory device includes: a vertical electrode extending in a vertical direction with respect to a substrate; a stack including interlayer dielectric layers and horizontal electrodes which are alternately stacked along the vertical direction; first oxide layers each interposed between the vertical electrode and the horizontal electrodes and each including a variable resistance material; and second oxide layers each interposed between the vertical electrode and the interlayer dielectric layers and each having an oxygen amount higher than the first oxide layer.

DETAILED DESCRIPTION

Figure 1:
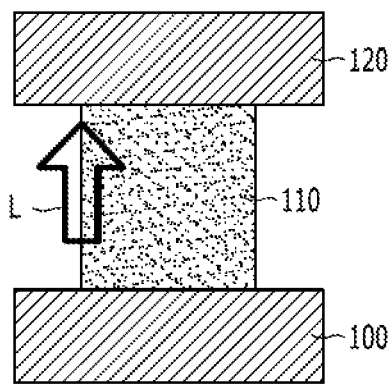
FIG. 1 is a cross-sectional view of a conventional variable resistance memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3A:
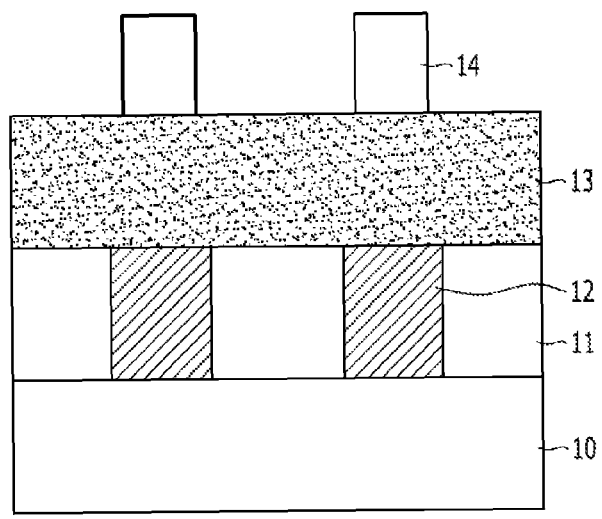
Figure 3B:
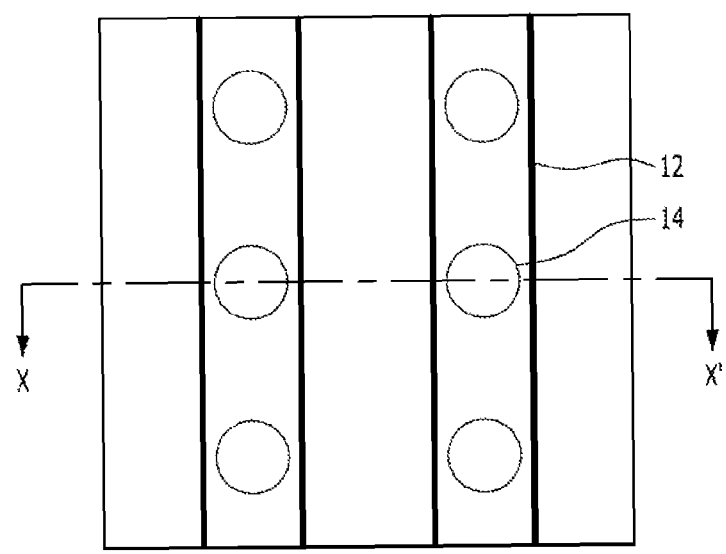
Figure 4A:
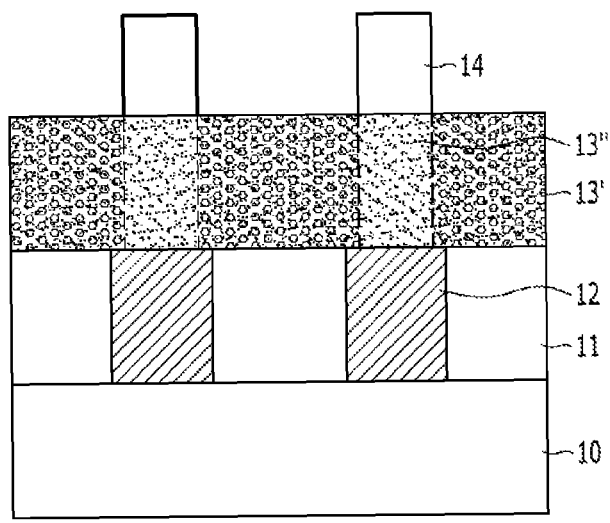
Figure 4B:
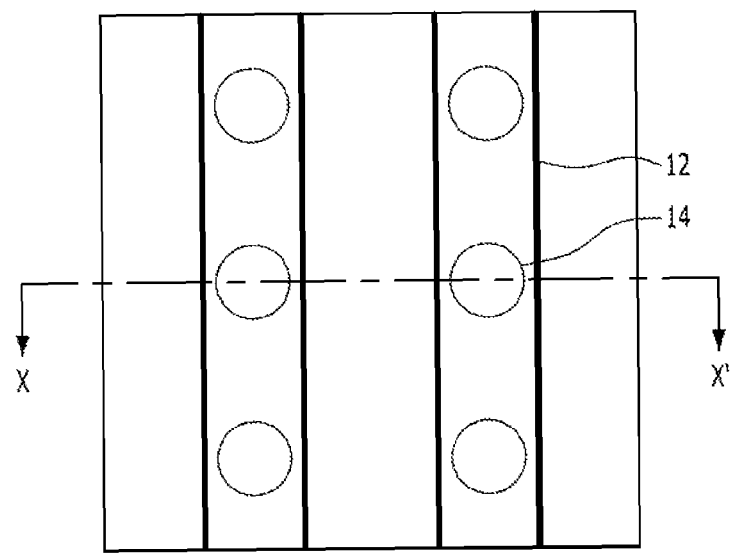
Figure 5A:
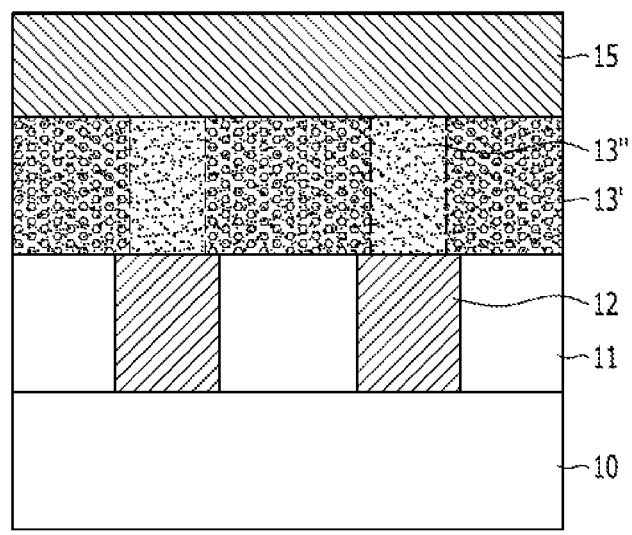
Figure 5B:
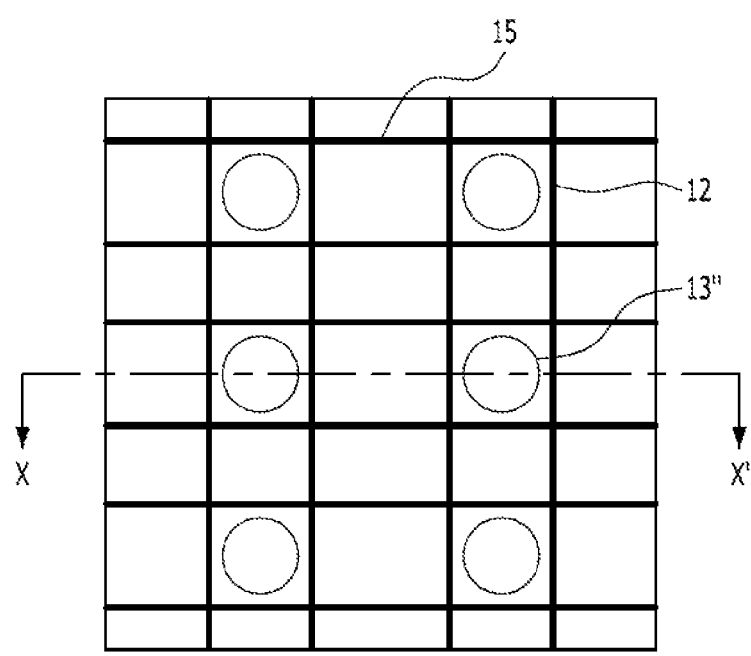

FIGS. 2A to 5B are diagrams for explaining a variable resistance memory device and a method for fabricating the same in accordance with an embodiment of the present invention. FIGS. 5A and 5B illustrate the nonvolatile memory device. FIGS. 2A to 4B illustrate intermediate steps for fabricating the device of FIGS. 5A and 5B. FIGS. 2B to 5B are plan views, and FIGS. 2A to 5A are cross-sectional views taken along the line X-X' of FIGS. 2B to 5B.

Figure 2A:
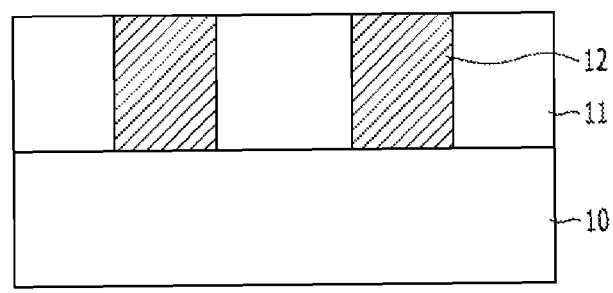
FIGS. 2A to 5B are diagrams for explaining a variable resistance memory device and a method for fabricating the same in accordance with an embodiment of the present invention.
Figure 2B:
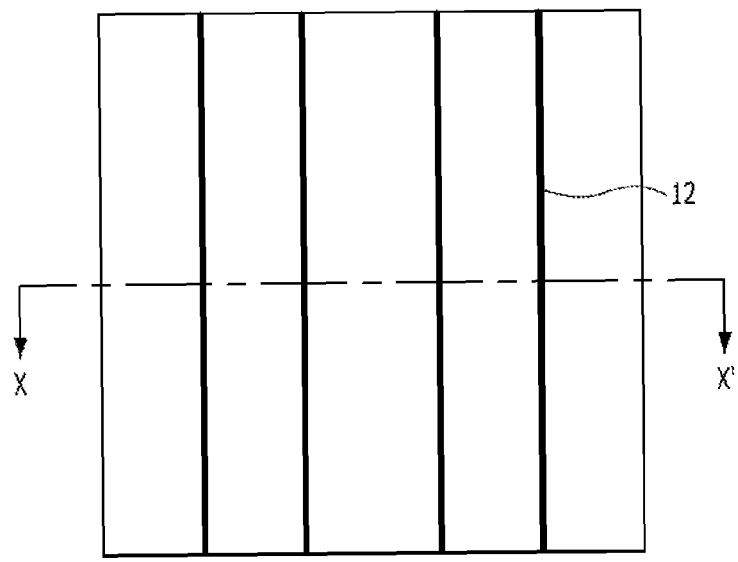

Referring to FIGS. 2A and 2B, a first insulating layer 11 having a first electrode 12 provided therein is formed over a substrate 10 including a predetermined lower structure (not illustrated).

The first electrode 12 serves to apply a voltage to a variable resistance pattern. The first electrode 12 may include a conductive material, for example, (i) a metal such as platinum (Pt), tungsten (W), aluminum (Al), copper (Cu), and tantalum (Ta) or (ii) a metal nitride such as titanium nitride (TiN) and tantalum nitride (TaN). The first electrode 12 may have a line shape extending in a first direction that crosses the line X-X', and a plurality of first electrodes may be arranged in parallel to each other. The first insulating layer 11 is filled between the first electrodes 12, and may be formed of oxide, for example.

The first insulating layer 11 and the first electrode 12 may be formed by the following process. First, a conductive material is deposited on the substrate 10, and patterned to form the first electrode 12. Then, an insulating material is deposited to such a thickness as to cover the first electrode 12, and a planarization process is performed until the first electrode 12 is exposed. Alternatively, an insulating material is deposited on the substrate 10, and patterned to form the first insulating layer 11. A trench is formed in an area where the first electrodes 12 are to be formed. Then, the trench is filled with a conductive material to form the first electrodes 12.

Referring to FIGS. 3A and 3B, a first oxide layer 13 having a variable resistance characteristic is formed over the first insulating layer 11 and the first electrode 12.

The first oxide layer 13 may include binary oxides such as Ti oxide, Ta oxide, Fe oxide, W oxide, Hf oxide, Nb oxide, Zr oxide, and Ni oxide, or ternary oxides such as PCMO (Pr-CaMnO).

The first oxide layer 13 contains a smaller ratio of oxygen compared to a stoichiometric material, and may include a plurality of oxygen vacancies. In this case, the variable resistance property of the first oxide layer 13 changes depending on whether a filament serving as a current path exists in the first oxide layer 13. The filament may be created or destroyed depending on a behavior of the oxygen vacancies in the first oxide layer 13. Specifically, when the filament is created in the first oxide layer 13 by the oxygen vacancies, the first oxide layer 13 is placed at a low-resistance state. On the other hand, when the filament is destroyed in the first oxide layer 13, the first oxide layer 13 is placed at a high-resistance state.

The first oxide layer 13 may be formed by a deposition method at a relatively low pressure, for example, at a pressure of 1E-2 to 1E-3 torr.

Then, a sacrifice pattern 14 is formed over the first oxide layer 13 so as to cover an area where a variable resistance pattern is to be formed.

The sacrifice pattern 14 may be formed of a material which is easy to remove, for example, photoresist or silicon oxide. The sacrifice pattern 14 is removed during a subsequent process.

When the sacrifice pattern 14 is formed of photoresist, the sacrifice pattern 14 may be formed by applying photoresist on the first oxide layer 13 and performing an exposure and development process. Alternatively, when the sacrifice pattern 14 is formed of an insulator such as silicon oxide, the sacrifice pattern 14 may be formed by depositing silicon oxide on the first oxide layer 13 and selectively etching the insulating layer.

Referring to FIGS. 4A and 4B, the first oxide layer 13 exposed by the sacrifice pattern 14 reacts with oxygen and is transformed into a second oxide layer 13', having increased oxygen content. That is, in the second oxide layer 13', oxygen vacancies are reduced. With the reduction of oxygen vacancies, it is difficult for the second oxide layer 13' to form a filament serving as a current path. Therefore, the second oxide layer 13' loses a variable resistance property, and is transformed into a high resistance material. As a result, while the first oxide layer 13 which does not react with oxygen maintains a variable resistance property, the second oxide layer 13' turns into an insulating layer. Hereafter, for convenience of description, the remaining first oxide layer 13, which does not react with oxygen, will be referred to as a variable resistance pattern 13".

As described above, the first oxide layer 13 may be formed of an oxide material containing a smaller ratio of oxygen than a stoichiometric ratio. The second oxide layer 13' may be formed of stoichiometric material. For example, if the second oxide layer 13' may include $Ta_2O_5$, and the first oxide layer 13 (or the variable resistance pattern 13") may include TaOx where x is smaller than 2.5.

Specifically, the process of changing the first oxide layer 13 into the second oxide layer 13' may be performed as follows.

First, a plasma treatment may be performed on the resultant structure shown in FIGS. 3A and 3B under an oxygen atmosphere. The oxygen atmosphere may include any atmospheres as long as they contain oxygen atoms. For example, the oxygen atmosphere may include an $O_2$-containing atmosphere, an $O_3$-containing atmosphere, and the like. During the plasma treatment, oxygen is ionized to increase the reactivity with the first oxide layer 13. Accordingly, the first oxide layer 13 easily turns into the second oxide layer 13' having high resistance.

Alternatively, a high-pressure annealing may be performed on the resultant structure of FIGS. 3A and 3B under an oxygen atmosphere. The oxygen atmosphere may include any atmospheres as long as they contain oxygen atoms. For example, the oxygen atmosphere may include an $O_2$-containing atmosphere, an $O_3$-containing atmosphere, and the like. The high pressure indicates an atmospheric pressure of 1 atm or more. Furthermore, the high pressure may be between 1 atm and 100 atm. The annealing may be performed at a relatively low temperature of 300° C. or less. When the annealing is performed at a relatively high pressure, that is, at an atmosphere pressure or more, the reactivity between the first oxide layer 13 and oxygen increases, and thus the first oxide layer 13 easily to turns into the second oxide layer 13' having high resistance.

Alternatively, an oxygen ion implantation process may be performed on the structure resulting from the process of FIGS. 3A and 3B.

During the process of oxidizing the first oxide layer 13, the reaction between the first oxide layer 13 and oxygen may be actively performed at the surface of the first oxide layer 13 exposed by the sacrifice pattern 14, and the reactivity may decrease in a bottom portion of the first oxide layer 13. Accordingly, although not illustrated, the width of the second oxide layer 13' in a horizontal direction may decrease from the top to the bottom.

Referring to FIGS. 5A and 5B, the sacrifice pattern 14 is removed, and a second electrode 15 is formed over the variable resistance pattern 13" and the second oxide layer 13' so as to be connected to the variable resistance pattern 13". The second electrode 15 is formed in a line shape. A second insulating layer (not shown) is provided between the second electrode 15 and a neighboring second electrode.

The removal of the sacrifice pattern 14 may be performed in various manners depending on the material forming the sacrifice pattern 14. For example, when the sacrifice pattern 14 is formed of photoresist, the sacrifice pattern 14 may be removed by an $O_2$ strip process or the like. Alternatively, when the sacrifice pattern 14 is formed of silicon oxide, the sacrifice pattern 14 may be removed by an etch process having a high etch rate with respect to the silicon oxide.

The second electrode 15 may include a conductive material, for example, a metal such as Pt, W, Al, Cu, or Ta or a metal nitride such as TiN or TaN. The second electrode 15 may have a line shape extended in a second direction parallel to line X-X', and a plurality of second electrodes 15 may be arranged in parallel to each other. Accordingly, each of the second electrodes 15 may be connected to the plurality of variable resistance patterns 13". The second insulating layer filled between the second electrodes 15 may include oxide.

The formation of the second electrode 15 and the second insulating layer may be performed in a similar manner to the formation of the first electrode 12 and the first insulating layer 11. Therefore, the detailed descriptions thereof are omitted herein.

Through the above-described fabrication method, the device of FIGS. 5A and 5B may be fabricated.

Referring to FIGS. 5A and 5B, the island-shaped variable resistance pattern 13" is interposed between the first electrode 12 extending in the first direction and the second electrode 15 extended in the second direction. The variable resistance patterns 13" are insulated from each other by the second oxide layer 13' surrounding the variable resistance patterns 13". Although not illustrated, an island-shaped conductive contact may be interposed between the first electrode 12 and the variable resistance pattern 13" and/or between the second electrode 15 and the variable resistance pattern 13" so as to overlap the variable resistance pattern 13".

In the variable resistance memory device and the method for fabricating the same in accordance with an embodiment of the present invention, since an etch process is not used during the formation process of the variable resistance pattern 13", damage to the sidewalls of the variable resistance pattern 13", which may occur during an etch process, can be prevented.

Furthermore, after the sacrifice pattern 14 is used to form the variable resistance pattern 13", subsequent processes are performed in a state where the sacrifice pattern 14 is removed. The subsequent processes may include the process of forming the second electrode 15 and the process of forming a conductive contact between the second electrode 15 and the variable resistance pattern 13". Therefore, the second electrode 15 and the conductive contact do not affect the formation process of the variable resistance pattern 13".

Furthermore, when these subsequent processes are performed after the sacrifice pattern 14 is removed, the line-shaped second electrode 15 may be formed to be in direct contact with the variable resistance pattern 13". Therefore, the manufacturing process may be simplified.

FIGS. 6A to 8B illustrate a variable resistance memory device and a method for fabricating the same in accordance with another embodiment of the present invention. The following descriptions will be focused primarily on a difference from the above-described embodiment.

Figure 6A:
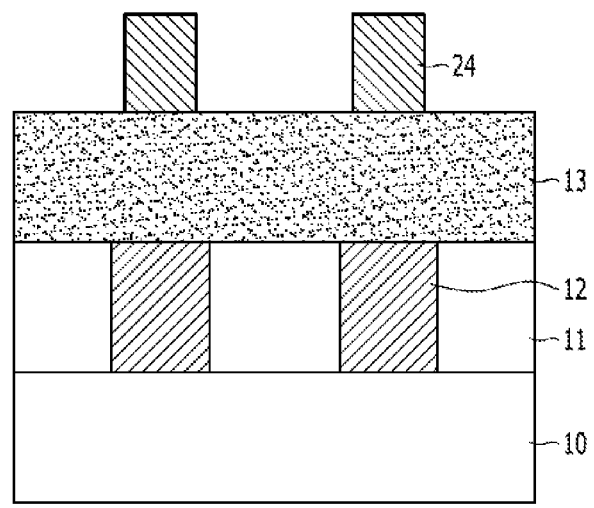
FIGS. 6A to 8B are diagrams for explaining a variable resistance memory device and a method for fabricating the same in accordance with another embodiment of the present invention.
Figure 6B:
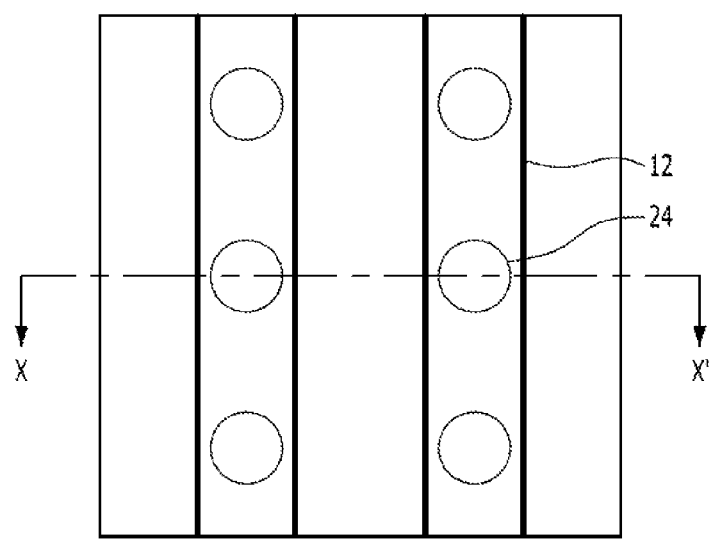

Referring to FIGS. 6A and 6B, a first insulating layer 11 having a first electrode 12 is formed over a substrate 10 having a predetermined lower structure (not illustrated), and a first oxide layer 13 having a variable resistance characteristic is formed.

Then, a conductive contact 24 is formed over the first oxide layer 13 so as to cover an area where a variable resistance pattern to be described below is to be formed.

The conductive contact 24 serves to connect the variable resistance pattern and a second electrode, which are described below, and has an island shape that overlaps with a variable resistance pattern. The conductive contact 24 may be formed by depositing a conductive material such as metal or metal nitride and selectively etching the conductive material. Over the conductive contact 24, a hard mask pattern (not illustrated) may further be formed.

Figure 7A:
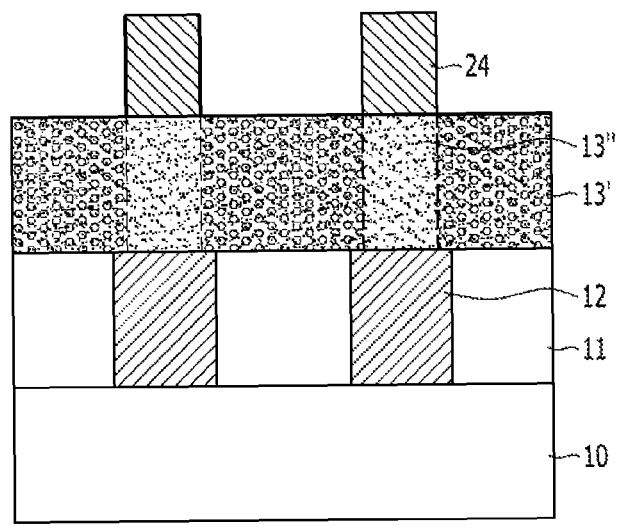
Figure 7B:
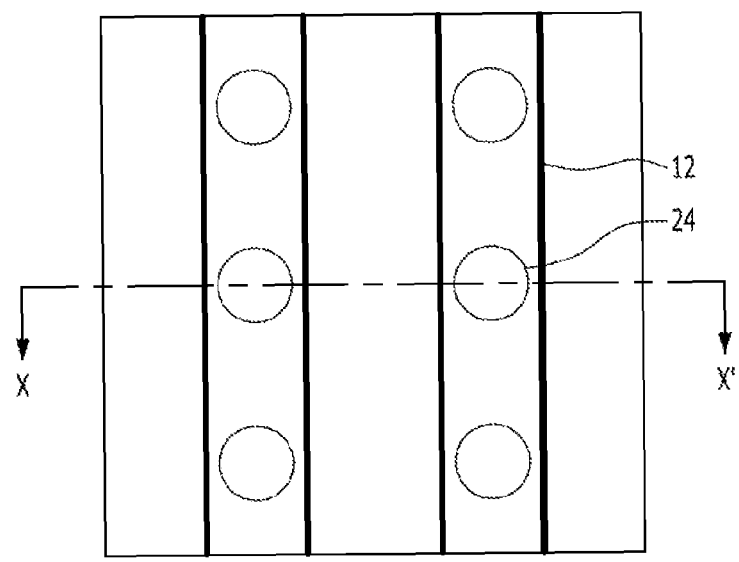

Referring to FIGS. 7A and 7B, a part of the first oxide layer 13 exposed by the conductive contact 24 reacts with oxygen and is transformed into a second oxide layer 13'''. Accordingly, a variable resistance pattern 13'' is defined. A difference in this embodiment from the above-described embodiment is that the conductive contact 24 is used as a mask in this process, instead of a sacrifice pattern 14.

Figure 8A:
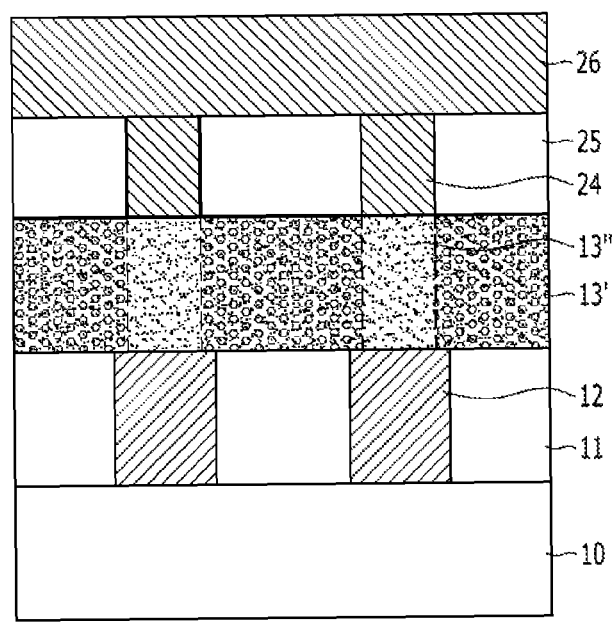
Figure 8B:
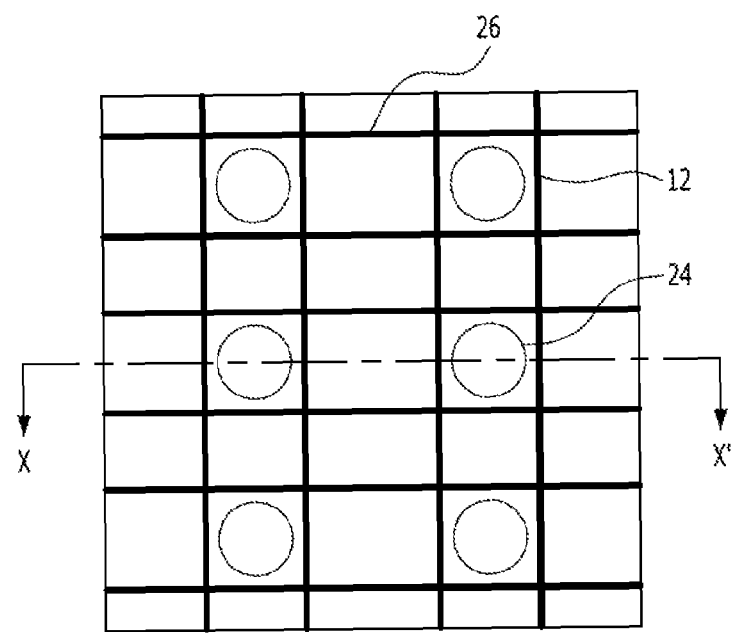

Referring to FIGS. 8A and 8B, a third insulating layer 25 is filled between the conductive contacts 24. The third insulating layer 25 may include oxide or the like, and may be formed by depositing an insulating material to cover the conductive contact 24 and performing a planarization process until the conductive contact 24 is exposed.

Then, a second electrode 26 is formed over the conductive contact 24 and the third insulating layer 25 so as to be connected to the conductive contact 24. A fourth insulating layer (not shown) is provided between neighboring second electrodes 26.

The second electrode 26 may have a line shape extending in a second direction parallel to line X-X', and a plurality of second electrodes 26 may be arranged in parallel to each other. Accordingly, each of the second electrodes 26 may be connected to a plurality of conductive contacts 24 extending perpendicular to the second direction.

Through the above-described fabrication method, the device of FIGS. 8A and 8B may be fabricated.

The device of FIGS. 8A and 8B is similar to the device of FIGS. 5A and 5B, except that the conductive contact 24 is used as a mask for processing the first oxide layer 13 and serves to connect the second electrode 26 and the variable resistance pattern 13".

In the variable resistance memory device and the method for fabricating the same in accordance with an embodiment of the present invention, an etch process is not used when the variable resistance pattern 13" is formed. Therefore, damage to the sidewalls of the variable resistance pattern 13", which may occur during an etch process, can be prevented.

FIGS. 9 to 14 are diagrams for explaining a variable resistance memory device and a method for fabricating the same in accordance with another embodiment of the present invention. The variable resistance memory device in accordance with this embodiment of the present invention has a 3D structure in which unit cells are stacked vertically from a substrate.

Figure 9:
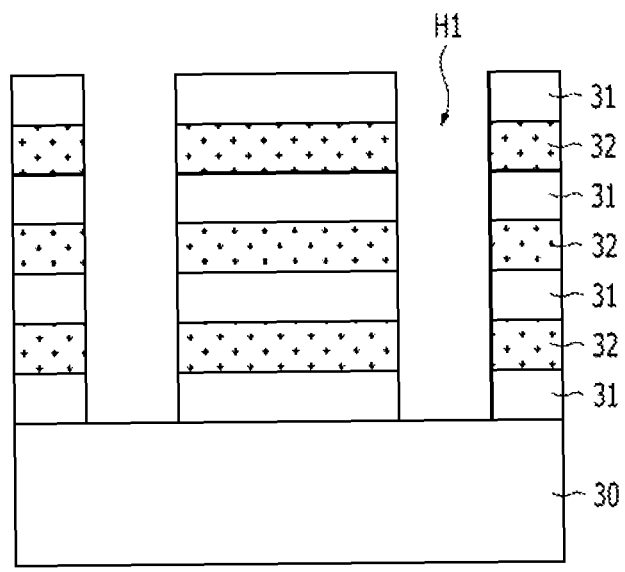
FIGS. 9 to 14 are diagrams for explaining a variable resistance memory device and a method for fabricating the same in accordance with yet another embodiment of the present invention.

Referring to FIG. 9, a plurality of first sacrifice layers 31 and second sacrifice layers 32 are alternately stacked over a substrate 30 having a predetermined lower structure.

The plurality of second sacrifice layers 32 are to be replaced with horizontal electrodes during a subsequent process, and may include a material having a different etching selectivity with respect to the first sacrifice layer 31. For example, the second sacrifice layers may include nitride. The plurality of first sacrifice layers 31 are to be removed during a subsequent process, and may include oxide, for example.

Then, the stacked structure of the first sacrifice layers 31 and the second sacrifice layers 32 is selectively etched to form a hole H1 exposing the substrate 30. The hole H1 provides an area where a vertical electrode is to be formed.

Figure 10:
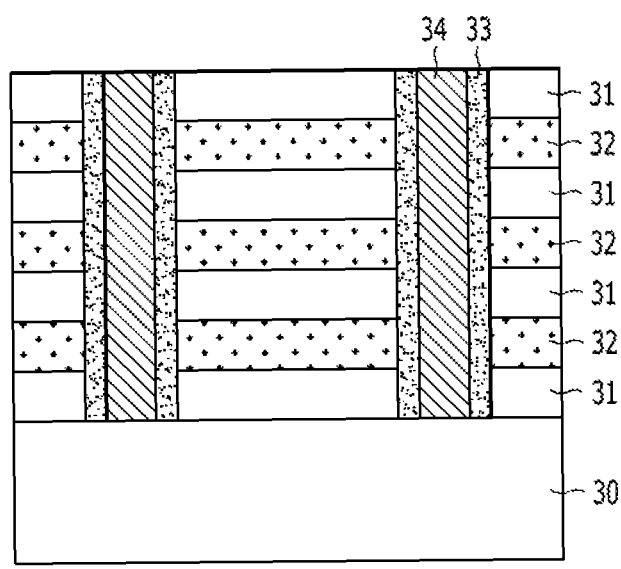

Referring to FIG. 10, the first oxide layer 33 having a variable resistance characteristic is formed on the sidewalls of the hole H1. The first oxide layer 33 may be substantially the same as the first oxide layer 13 of the above-described embodiments of the present invention.

The hole H1 is filled with a conductive material to form a vertical electrode 34 extending in a vertical direction with respect to the substrate 30.

Figure 11:
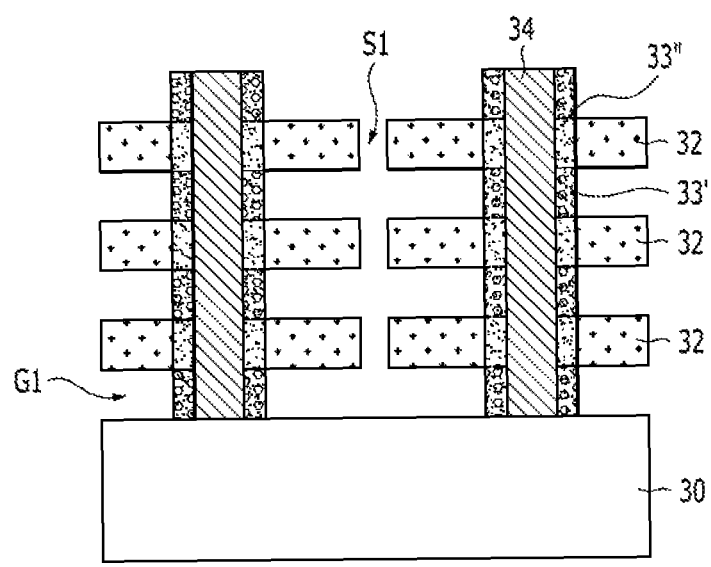

Referring to FIG. 11, the stacked structure of the first sacrifice layers 31 is selectively etched away to form a first slit S1. A wet etching solution is supplied along the first slit S1 to remove the first sacrifice layers 31.

The first sacrifice layers 31 are removed by wet etching or the like to from a plurality of first grooves G1 exposing the first oxide layer 33. The exposed part of the first oxide layer 33 reacts with oxygen and is transformed into a second oxide layer 33', of which oxygen vacancies are reduced. The second oxide layer 33' may be substantially the same as the second oxide layer 13 of the above-described embodiments. Accordingly, the second oxide layer 33' serves as an insulating layer having high resistance. Hereafter, for convenience of description, the remaining first oxide layer 33, which does not react with oxygen during this process, will be referred to as a variable resistance pattern 33".

The process of oxidizing the first oxide layer 33 may include a plasma treatment or high-pressure annealing under an oxygen atmosphere. In this process, the reaction between oxygen and the surface of the first oxide layer 33 exposed by the first groove G1 may be relatively actively performed, and the reactivity may decrease at a boundary between the vertical electrode 34 and the first oxide layer 33. Accordingly, although not illustrated, the width of the second oxide layer 33' may decrease from a top surface of the first oxide layer 33 toward a bottom of the first oxide layer 33.

Figure 12:
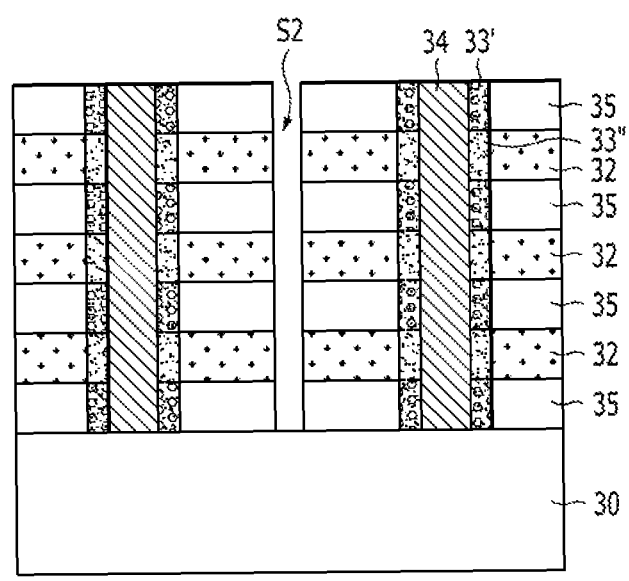

Referring to FIG. 12, an interlayer dielectric layer 35 is formed to fill the first groove G1. The interlayer dielectric layer 35 may be formed of oxide, for example.

The interlayer dielectric layer 35 may be formed by the following process. An insulating material is deposited to cover the resultant structure shown in FIG. 11, a planarization process is performed until the vertical electrode 34 is exposed, and a second slit S2 is formed. Through the second slit S2, a wet etching solution for removing the second sacrifice layers 32 is provided. The second slit S2 may extend to the lowermost second sacrifice layer 32 to expose the substrate 30.

Figure 13:
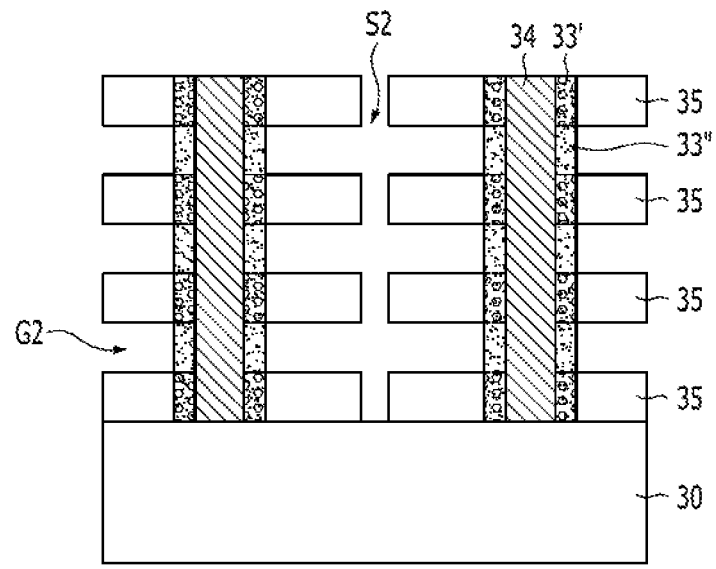

Referring to FIG. 13, a plurality of second grooves G2 are formed by removing the second sacrifice layers 32 exposed by the second slit S2 through a wet etching process or the like.

Figure 14:
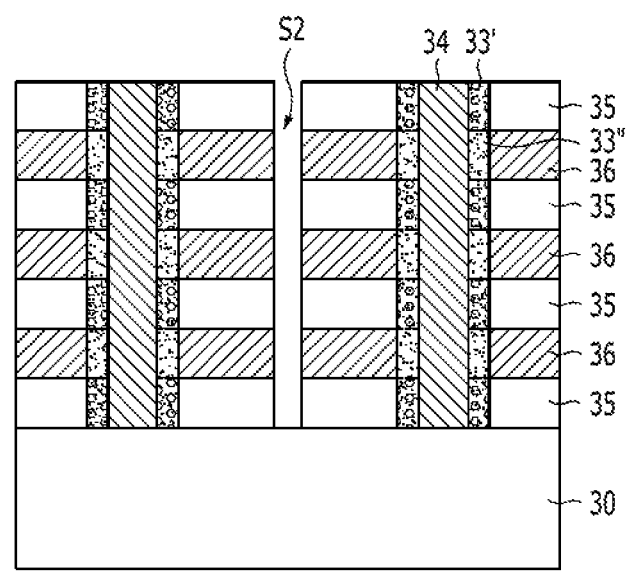

Referring to FIG. 14, each of the second grooves G2 is filled with a conductive material to form a horizontal electrode 36 coupled to the variable resistance pattern 33".

Through the above-described process, the variable resistance memory device of FIG. 14 is fabricated. In the variable resistance memory device in accordance with this embodiment of the present invention, one vertical electrode 34, one layer of horizontal electrode 36 connected with the vertical electrode 34, and one variable resistance pattern 33" interposed therebetween, form a unit cell. The second oxide layer 33' between the variable resistance patterns 33" may serve to insulate variable resistance patterns 33" of different cells.

Figure 15:
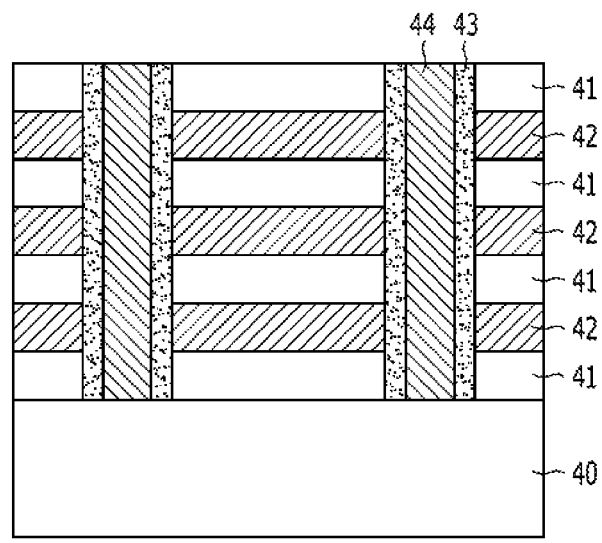
FIGS. 15 and 16 are diagrams for explaining a variable resistance memory device and a method for fabricating the same in accordance with still another embodiment of the present invention.
Figure 16:
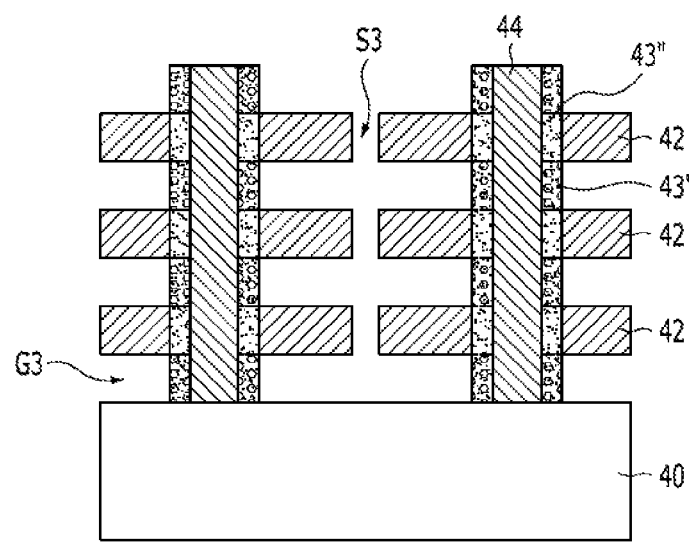

FIGS. 15 and 16 are diagrams for explaining a variable resistance memory device and a method for fabricating the same in accordance with still another embodiment of the present invention. The following description will be focused on a difference from the embodiment of FIGS. 9 to 14.

Referring to FIG. 15, a plurality of first sacrifice layers 41 and conductive layers 42 are alternately stacked over a substrate 40 having a predetermined lower structure.

Although not shown, the plurality of conductive layers 42 for forming horizontal electrodes may be formed of impurity-doped polysilicon, for example. The first sacrifice layer 41 is to be removed during a subsequent process, and may include a material having a different etching selectivity from the conductive layer 42. For example, the first sacrifice layer may include any of oxide, nitride, and undoped polysilicon.

Although not shown, the first sacrifice layers 41 is selectively etched away to form a hole exposing the substrate 40. Then, a first oxide layer 43 having a variable resistance characteristic is formed on the sidewalls of the hole, and a vertical electrode 44 is formed by filling the remaining space in the hole with a conductive material.

Referring to FIG. 16, the stacked structure of the first sacrifice layers 41 and the conductive layers 42 is etched to form a slit S3 exposing the substrate 40.

The first sacrifice layers 41 exposed by the slit S3 are removed by a wet etching process or the like to form a plurality of grooves G3 exposing the first oxide layer 43. Then, the exposed part of the first oxide layer 43 reacts with oxygen and is transformed into a second oxide layer 43', of which oxygen vacancies are reduced. Hereafter, for convenience of description, the remaining first oxide layer 43, which does not react with oxygen during this process, will be referred to as a variable resistance pattern 43".

Although not illustrated, the grooves G3 may be filled with an insulating material, for example, oxide, thereby acquiring a variable resistance memory device having substantially the same structure as that of FIG. 14.

In accordance with the embodiments of the present invention, it is possible to facilitate and simplify the process of forming variable resistance patterns 13", 23", 33", 43" and improve characteristics of the device.

While the present invention has been described with respect to specific embodiments, it will be apparent to those skilled in the art that various changes and modifications may be made without departing from the spirit and scope of the invention as defined in the following claims.

What is claimed is:

1. A method for fabricating a variable resistance memory device, comprising:
    providing a first insulating layer having a first electrode;
    forming a first oxide layer including a variable resistance material over the first electrode and the first insulating layer;
    forming a sacrifice pattern over the first oxide layer;
    forming a second oxide layer by reacting the first oxide layer exposed by the sacrifice pattern with oxygen;
    removing the sacrifice pattern; and
    forming a second electrode over the second oxide layer and the first oxide layer so as to be coupled to the first oxide layer.

2. The method of claim 1, wherein the forming of the second oxide layer is performed by an oxygen ion implantation process.

3. The method of claim 1, wherein the forming of the second oxide layer is performed by a plasma treatment under an oxygen atmosphere.

4. The method of claim 1, wherein the forming of the second oxide layer is performed by an annealing process under an oxygen atmosphere at an atmospheric pressure or more.

5. The method of claim 1, wherein the second oxide layer is a stoichiometric material, and wherein a ratio of oxygen in the first oxide layer is smaller than a stoichiometric material.

6. The method of claim 1, wherein the sacrifice pattern is formed of a photoresist or an insulating layer.

7. The method of claim 1, wherein the first electrode extends in a first direction,
    wherein the second electrode extends in a second direction crossing the first direction, and
    wherein the second electrode is in direct contact with the first oxide layer.

8. The method of claim 1, wherein the second oxide layer includes an insulating material.

9. A variable resistance memory device comprising:
    first electrodes extending in a first direction;
    second electrodes disposed over the first electrodes and extending in a second direction crossing the first direction;
    first oxide layers disposed between the first electrodes and the second electrodes at intersections of the first electrodes and the second electrodes coupling the first and second electrodes, the first oxide layers including a variable resistance material; and
    a second oxide layer filling an entire space between the first oxide layers and completely surrounding sidewalls of the first oxide layers, the second oxide layer including a stoichiometric material having same elements of the variable resistance material, wherein the variable resistance material has a smaller ratio of oxygen compared to the stoichiometric material.

10. The variable resistance memory device of claim 9, wherein the second electrodes are in direct contact with the first oxide layers.

11. The variable resistance memory device of claim 9, wherein the second oxide layer includes an insulating material.

12. The variable resistance memory device of claim 9, wherein a width of the second oxide layer becomes narrower from the top toward the bottom.

13. A method for fabricating a variable resistance memory device, comprising:
    alternately stacking first layers and sacrifice layers over a substrate to form a stack structure;
    etching the stack structure to form a hole exposing sidewalls of the first layers and sidewalls of the sacrifice layers;
    forming a first oxide layer including a variable resistance material over a sidewall of the hole;
    forming a first electrode in the hole;
    removing the sacrifice layers to expose first portions of the first oxide layer; and
    forming a second oxide by reacting the exposed first portions of the first oxide layer with oxygen.

14. The method of claim 13, wherein the forming of the second oxide layer is performed by a plasma treatment under an oxygen atmosphere.

15. The method of claim 13, wherein the forming of the second oxide layer is performed by an annealing under an oxygen atmosphere at an atmospheric pressure or more.

16. The method of claim 13, wherein the second oxide layer is a stoichiometric material, and
    wherein a ratio of oxygen in the first oxide layer is smaller than a stoichiometric material.

17. The method of claim 13, wherein the first layers are formed of a conductive material and serve as second electrodes.

18. The method of claim 13, wherein the first layers are formed of an insulating material, and
    wherein the method further comprises, after the forming of the second oxide layer:
    forming interlayer dielectric layers by filling first spaces which are formed when the sacrifice layers are removed;
    removing the first layers to form second spaces; and
    filling conductive materials in the second spaces to form second electrodes.

19. The method of claim 13, wherein the second oxide layer includes an insulating material.

20. A variable resistance memory device comprising:
    a vertical electrode extending in a vertical direction with respect to a substrate;
    a stack including interlayer dielectric layers and horizontal electrodes which are alternately stacked along the vertical direction;
    first oxide layers each interposed between the vertical electrode and the horizontal electrodes and each including a variable resistance material; and
    second oxide layers each interposed between the vertical electrode and the interlayer dielectric layers, the second oxide layers each including a stoichiometric material having same elements of the variable resistance material,
    wherein the variable resistance material has a smaller ratio of oxygen compared to the stoichiometric material,
    wherein the first oxide layers and the second oxide layers are alternately stacked along the vertical direction, and
    wherein a width of each of the second oxide layers narrows down along the vertical direction from an interface with the interlayer dielectric layer toward an interface with the vertical electrode.

21. The variable resistance memory device of claim 20, wherein each of the second oxide layers includes an insulating material.

\* \* \* \* \*